(12) United States Patent
Patil et al.

(10) Patent No.: US 11,119,384 B2
(45) Date of Patent: Sep. 14, 2021

(54) HERMETIC SEALING OF A NONLINEAR CRYSTAL FOR USE IN A LASER SYSTEM

(71) Applicant: KLA-Tencor Corporation, Milpitas, CA (US)

(72) Inventors: Rajeev Patil, Fremont, CA (US); David Ramirez, Fremont, CA (US); Yevgeniy Churin, San Jose, CA (US); William Replogle, Livermore, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 316 days.

(21) Appl. No.: 16/133,611

(22) Filed: Sep. 17, 2018

(65) Prior Publication Data

US 2019/0094653 A1 Mar. 28, 2019

Related U.S. Application Data

(60) Provisional application No. 62/564,487, filed on Sep. 28, 2017.

(51) Int. Cl.
| | |
|---|---|
| *G02F 1/35* | (2006.01) |
| *H01L 21/67* | (2006.01) |
| *H01S 3/00* | (2006.01) |

(52) U.S. Cl.
CPC ...... *G02F 1/3501* (2013.01); *H01L 21/67288* (2013.01); *H01S 3/0092* (2013.01); *G02F 1/353* (2013.01); *G02F 1/3505* (2021.01)

(58) Field of Classification Search
CPC .............. G02F 1/3501; G02F 1/353; G02F 2001/3505; H01L 21/67288; H01S 3/0092
See application file for complete search history.

(56) References Cited

U.S. PATENT DOCUMENTS

| | | |
|---|---|---|
| 5,441,803 A | 8/1995 | Meissner |
| 5,846,638 A | 12/1998 | Meissner |

(Continued)

FOREIGN PATENT DOCUMENTS

| | | | | |
|---|---|---|---|---|
| CN | 101567517 A | * | 10/2009 | ............... H01S 5/00 |
| CN | 202292781 U | | 7/2012 | |

(Continued)

OTHER PUBLICATIONS

English computer translation of CN 101567517 A. (Year: 2020).*

(Continued)

*Primary Examiner* — Matthew J Song
(74) *Attorney, Agent, or Firm* — Kwan & Olynick LLP

(57) ABSTRACT

Disclosed are methods and apparatus for hermetically sealing a nonlinear optical (NLO) crystal for use in a laser system. A mounted NLO crystal, an enclosure base, a lid, and a plurality of window components are moved into an oven. A vacuum bake process is then performed on the mounted NLO crystal, enclosure base, lid, and plurality of window components until a humidity level that is less than a predefined amount is reached. The mounted NLO crystal, enclosure base, lid, and plurality of window components are moved from the oven onto a stage of a glove box that includes a sealing tool. In the glove box, the mounted NLO crystal is hermetically sealed into the enclosure base by sealing the lid and plurality of window components into openings of the enclosure base.

20 Claims, 6 Drawing Sheets

(56) References Cited

U.S. PATENT DOCUMENTS

| | | |
|---|---|---|
| 6,103,988 A | 8/2000 | Kim |
| 6,284,085 B1 | 9/2001 | Gwo |
| 6,621,580 B2 | 9/2003 | Myatt et al. |
| 7,803,451 B2 | 9/2010 | Lee et al. |
| 8,298,335 B2 | 10/2012 | Armstrong |
| 9,250,178 B2 | 2/2016 | Chuang et al. |
| 2002/0186376 A1 | 12/2002 | Brown |
| 2004/0218641 A1 | 11/2004 | Mizell |
| 2005/0265413 A1* | 12/2005 | Tsuda .................. H01S 5/02212 372/43.01 |
| 2009/0080475 A1* | 3/2009 | Yoshimura ................ G02F 1/37 372/22 |
| 2009/0294050 A1 | 12/2009 | Traggis et al. |
| 2010/0215890 A1 | 8/2010 | Lee et al. |
| 2010/0272964 A1 | 10/2010 | Traggis et al. |
| 2011/0013661 A1* | 1/2011 | Assion .................... H01S 3/025 372/98 |
| 2011/0317136 A1 | 12/2011 | Ryzhikov et al. |
| 2015/0331299 A1* | 11/2015 | Heidemann ........ G02B 27/0006 359/326 |
| 2017/0003572 A1* | 1/2017 | Woll ....................... G02F 1/353 |

FOREIGN PATENT DOCUMENTS

| | | |
|---|---|---|
| EP | 350685 B1 | 8/1994 |
| EP | 737876 A2 | 10/1996 |
| JP | 2001051311 A | 2/2001 |
| JP | 2003075698 A | 3/2003 |
| JP | 2009117406 A | 5/2009 |
| WO | 2002099499 A1 | 12/2002 |
| WO | 2013052878 A1 | 6/2016 |
| WO | 2016089449 A1 | 6/2016 |

OTHER PUBLICATIONS

Written Opinion for PCT/US2018/052508, dated Jan. 18, 2019. 4 pages.
International Search Report, PCT/US2015/067349, dated Oct. 14, 2015, 2 pages.
International Search Report, PCT/US2018/052508, International filing date Sep. 25, 2018. dated Jan. 18, 2019. 3 pages.

* cited by examiner

HERMETIC SEALING OF A NONLINEAR CRYSTAL FOR USE IN A LASER SYSTEM

CROSS-REFERENCE TO RELATED APPLICATION

This application claims priority to U.S. Provisional Patent Application No. 62/564,487, filed 28 Sep. 2017, entitled USE OF HERMETIC SEALING NONLINEAR CRYSTAL IN FHG CAVITY OF HIGH POWER 266 NM LASER/DUV LASERS, by Rajeev Patil et al., which application is incorporated herein by reference in its entirety for all purposes.

TECHNICAL FIELD OF THE INVENTION

The invention generally relates to a laser system suitable for implementation as a light source of a semiconductor wafer or photomask inspection or metrology system, and more particularly, to preventing moisture damage in crystals used in such laser systems.

BACKGROUND

Various inspection and metrology systems are used within the semiconductor industry to detect defects or measure characteristics on semiconductor reticles or wafers. As the dimensions of semiconductor devices and components continue to decrease, the demand for semiconductor wafer and photomask inspection systems exhibiting high throughput and improvements in resolution continue to increase. One manner in which higher levels of resolution are attained includes the utilization of an illumination source capable of emitting high power, shorter wavelength light.

Lasers can be used to provide high power, shorter wavelength illumination via a frequency conversion arrangement. In a specific implementation, a laser system is constructed using a non-linear optical (NLO) crystal that is arranged to receive a standard laser's beam and perform a frequency conversion so as to output a halved wavelength beam. For example, a CLBO ($CsLiB_6O_{10}$) crystal can be used to halve the 532 nm wavelength to achieve a 266 nm wavelength.

However, certain NLO crystals, such as CLBO crystals, are extremely sensitive to humidity. Exposing this type of crystal to 45% room humidity for longer than a few minutes tends to cause rapid degradation of the crystal surface, which can lead to a reduced performance and/or optical damage. A clean room environment often has a 65% room humidity, which will pose a significant risk to the crystal's reliability. Humidity can arise during any stage of a crystal's life cycle, such as during assembly, testing, shipping, storage, replacement, or operation.

There is a continuing need for improved techniques and systems for preventing humidity from damaging crystals that are used in laser systems.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method for hermetically sealing a nonlinear optical (NLO) crystal for use in a laser system is disclosed. A mounted NLO crystal, an enclosure base, a lid, and a plurality of window components are moved into an oven. A vacuum bake process is then performed on the mounted NLO crystal, enclosure base, lid, and plurality of window components until a humidity level that is less than a predefined amount is reached. The mounted NLO crystal, enclosure base, lid, and plurality of window components are moved from the oven onto a stage of a glove box that includes a sealing tool. In the glove box, the mounted NLO crystal is hermetically sealed into the enclosure base by sealing the lid and plurality of window components into openings of the enclosure base to thereby form a crystal enclosure.

In a specific implementation, during loading and vacuum baking, the mounted NLO crystal resides in a processing enclosure in which such crystal was processed, and the mounted NLO crystal is removed from the processing enclosure within the glove box. In another aspect, the enclosure base, lid, and windows are assembled prior to placing such assembled enclosure in the oven. In another aspect, at least some of the enclosure base, lid, and plurality of window components are placed separately without assembly into the oven, and the method includes assembling the mounted NLO crystal and the at least some of the enclosure base, lid, and windows to form an assembled enclosure around the mounted NLO crystal in the glove box. In another embodiment, a getter or desiccant material is loaded, vacuum baked, and hermetically sealed into the enclosure base with the mounted NLO crystal.

In one aspect, a door between the oven and glove box is automatically opened when the humidity level is less than a predefined amount. In a further aspect, the predefined amount for the humidity level is less than one part per million. In another embodiment, the operations of loading, vacuum baking, moving, and hermetically sealing for a mounted NLO crystal are only performed after performing such operations without a mounted NLO crystal in a test run that results in no leaks from the crystal enclosure. In a further aspect, the hermetically sealing operation is performed in an atmosphere that includes a tracer gas that is detected in the test run if there is a leak in the crystal enclosure.

In a specific embodiment, the sealing tool is a laser weld, and the window components are temporarily covered prior to performing the operation of hermetically sealing to prevent contamination of the window components with welding particulates. In a further aspect, a laser system is assembled using the crystal enclosure. In another embodiment, the laser system is stored in an ambient environment at least 5 minutes (or in another example, more than 1 week). In another aspect, the laser system is mounted into a semiconductor inspector tool.

In an alternative embodiment, the invention is directed towards a system for hermetically sealing a nonlinear optical (NLO) crystal for use in a laser system. The system includes an oven for receiving and baking a mounted NLO crystal, an enclosure base, a lid, and a plurality of window components, wherein the NLO crystal has been processed for frequency conversion. The system further includes an environmentally controlled chamber coupled with the oven and having a stage for receiving the mounted NLO crystal, enclosure base, lid, and plurality of window components from the oven after baking has resulted in a humidity level that is less than a predefined amount that will not damage the mounted NLO crystal. The chamber includes a sealer tool for hermetically sealing the mounted NLO crystal into the enclosure base by sealing the lid and plurality of window components into openings of the enclosure base with the crystal being inside a cavity of the enclosure base. The system further includes a controller for causing, in cooperation with the oven and sealing tool, to perform one or more of the above-described method operations.

In one system aspect, the chamber is a glove box, and the controller is configured to prompt a user to position the mounted NLO crystal, enclosure base, lid, and plurality of window components from the oven to the stage of the glovebox in an orientation to seal each of the lid and window components onto the enclosure base with the mounted crystal inside. In other aspects, the base includes a cavity that is sized to receive and prevent movement of the mounted NLO crystal. In yet another embodiment, the enclosure base and lid are formed from a metallic material, and the window components each include a window mounted in a metallic material. In another aspect, the interiors of the oven and chamber are formed without hydrocarbons or siloxanes.

These and other aspects of the invention are described further below with reference to the figures.

DETAILED DESCRIPTION OF EXAMPLE EMBODIMENTS

Figure 1:
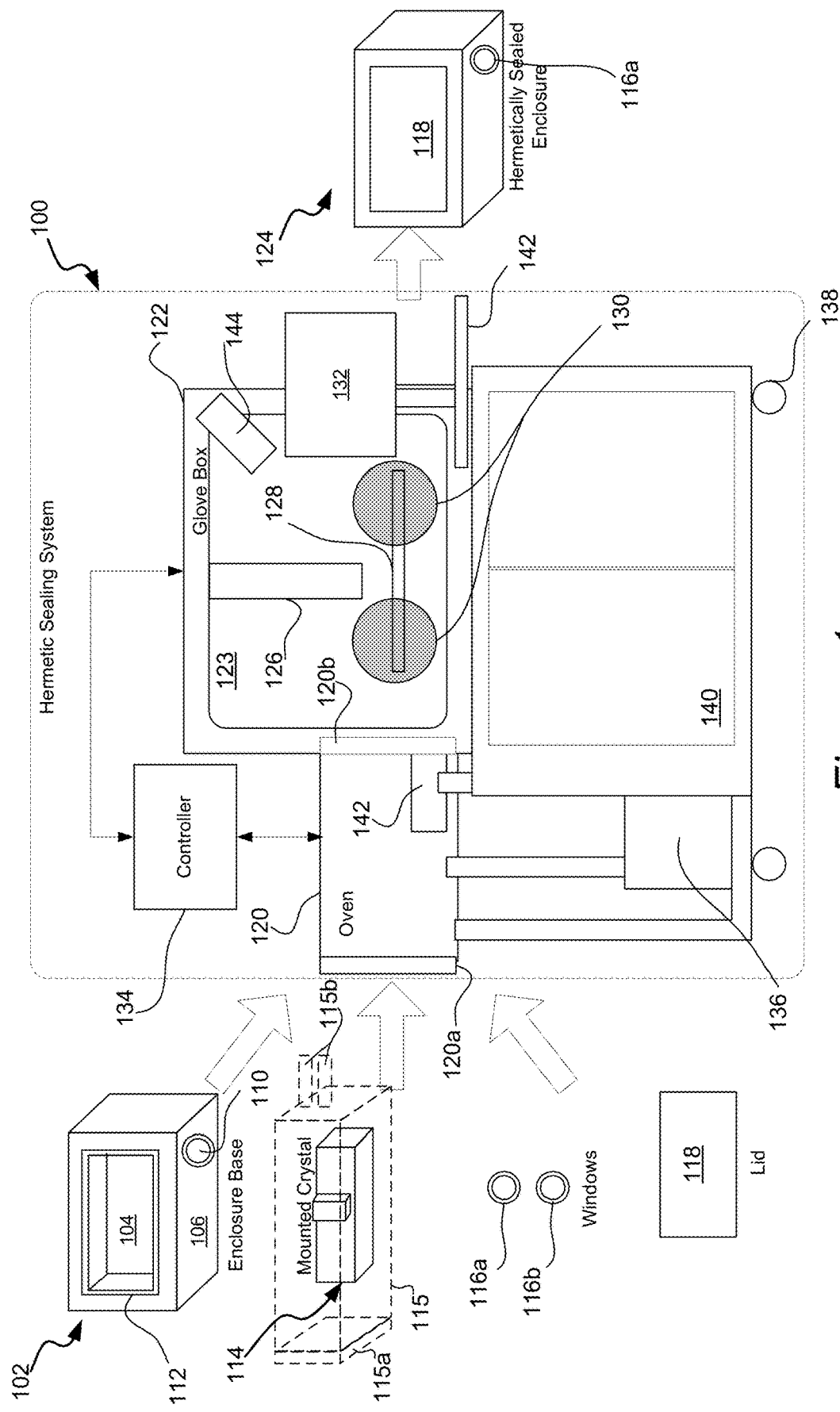
FIG. 1 is a diagrammatic representation of a system for hermetically sealing an optical crystal in accordance with a specific implementation of the present invention.

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

Laser systems commonly utilize NLO crystals for many applications such as frequency mixing, Raman amplification, Kerr-lens mode-locking, electro-optic modulation, and acousto-optic modulation, among others. In a deep ultraviolet (DUV) frequency conversion application, several crystals are typically cut from a boule and processed in a controlled environment to induce frequency conversion capabilities in such crystals. After an optical crystal is processed to activate its frequency conversion operation, the processed crystal is typically kept under purge conditions that minimize humidity exposure to the crystal. Referring generally to FIGS. 1 through 5, systems and techniques for hermetically sealing a processed nonlinear optical (NLO) crystal within a hermetically sealed enclosure having windows for use as a laser inspection or metrology system are described in accordance with the present disclosure. The enclosure allows use of the processed crystal in an ambient environment during assembly, testing, shipping, storage, operation, and replacement while protecting the crystal from humidity effects.

As used throughout the present disclosure, the term "crystal", "NLO crystal", or "nonlinear crystal" generally refers to a nonlinear optical crystal suitable for frequency conversion. For example, the nonlinear optical crystal of the present invention may be configured to frequency convert incident illumination of a first wavelength (e.g., 532 nm) to an output illumination of a shorter wavelength (e.g., 266 nm). Further, the nonlinear optical crystal of the present invention may include, but is not limited to, beta-Barium Borate (BBO), Lithium Triborate (LBO), Lithium Tetraborate (LTB), Cesium Lithium Borate (CLBO), Cesium Borate (CBO), oxide-type non-linear crystals, and the like.

One suitable use application of the hermetically sealed crystal is in a wafer or reticle inspection or metrology tool although other uses are contemplated. As used throughout the present disclosure, the term "wafer" generally refers to a substrate formed of a semiconductor or non-semiconductor material. For example, semiconductor or non-semiconductor materials include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

FIG. 1 is a diagrammatic representation of a hermetic crystal sealing system 100 in accordance with a specific implementation of the present invention. In general, the hermetic sealing system 100 is configured to remove water from assembly components, which are then sealed together in a controlled environment to form a hermetically sealed enclosure around one or more crystals. As shown, the hermetic sealing system 100 may include an oven 120 for removing water content and an environmentally controlled glove box 122 for allowing a user to facilitate assembly and hermetic sealing of the enclosure via a laser welder 126. The glove box also preferably includes a window 123.

The system 100 may also include a controller 134 for controlling and monitoring various components, such as vacuum and gas pumps (for environment control, vacuum, purging, regeneration and clearing of hydrocarbons), pressure/temperature/water sensors and timers for the oven 120 and/or glove box 122, laser welder 126, movement of stage 128, oven interlock doors 120a and 120b, microscope/camera 144, display 132, keyboard 142, any other user interface devices, etc. The system 100 may also include a cabinet 140 for storage and wheels 138 for mobility.

Although the glove box embodiment allows a user to guide the sealing process by manipulating and moving the assembly within the glove box 122, robotic arms may alternatively be configured to provide such functions within a simple controlled-environment chamber. Additionally, although the illustrated example is directed towards hermetically sealing a single crystal into a single enclosure, the techniques and systems can be applied to sealing multiple crystals into a single enclosure.

The enclosure base 102 may include a lid opening 112 for receiving the lid 118 and two window openings for placement of two corresponding windows 116a and 116b for receiving and outputting a laser beam. A first window opening 110 is formed in a first side 106, while a second window opening (not shown) is formed in second side that is opposite the first side 106. Additionally, the lid opening 112 of the base 102 may include a ledge upon which the lid 118 may be placed. Likewise, the window holes (e.g., 110) may include ledges for easy insertion and welding of the windows 116a and 116b. The base 102 also includes a cavity 104 for receiving the mounted crystal 114 via the lid opening 112. The cavity 104 is preferably sized to snuggly fit the mounted crystal 114 so as to prevent movement of the crystal.

Providing a window at Brewster's angle requires the window to be mounted in proximity of Brewster's angle. One method includes machining the base 102 to support a window at this angle (not shown). The window cavities are placed far enough away from the crystal so the windows (once sealed into place) will not be damaged by the light focused into the crystal or the light exiting the crystal. This distance can be calculated based on the light wavelengths, the focusing conditions into the crystal and enclosure, the crystal type, the window material, the window orientation, and any coatings that may be on the crystal or windows.

In general, the hermetic base 102, lid 118, and windows 116a and 116b may take any form that can be sealed together to form a hermetic crystal enclosure or cuvette (e.g., 124), via the particular sealing mechanism and environment, and then mounted into a laser system using any suitable mounting mechanisms. Example sealing mechanisms may include laser or e-beam welding, bonding, fusing, etc. Example mounting mechanisms may include bolts, welds, bonding, fusing, etc. Metallic materials may be selected for ease of use in welding and typical mounting mechanisms.

In one example, the hermetic base 102 and lid 118 are formed from Titanium. Each window may include a holding ring that can be used to fix the window to its corresponding window opening in the base 102. For instance, each window 116a and 116b is sealed into a metallic ring that can later be welded into a corresponding window hole (e.g., 110) of the base 102. In one example, each window is brazed or welded into a ring. The base 102, lid 118, and window rings may be formed from a variety of metals or materials including but not limited to titanium, stainless steel, aluminum, beryllium copper, copper, brass, nickel, invar, covar, etc. With a titanium enclosure material, window rings that are formed from titanium appear to work well. The base 102, lid, and each ring of window components 116a and 116b may be coated with nickel and/or electropolished. An anti-reflective coating may also be applied to each window.

The hermetic sealing system 100 may generally be formed with any suitable materials that do not adversely affect the crystal before it is sealed. For example, the components are formed without using any hydrocarbons or siloxanes in the construction since these materials adversely affect the crystal over time.

Figure 2:
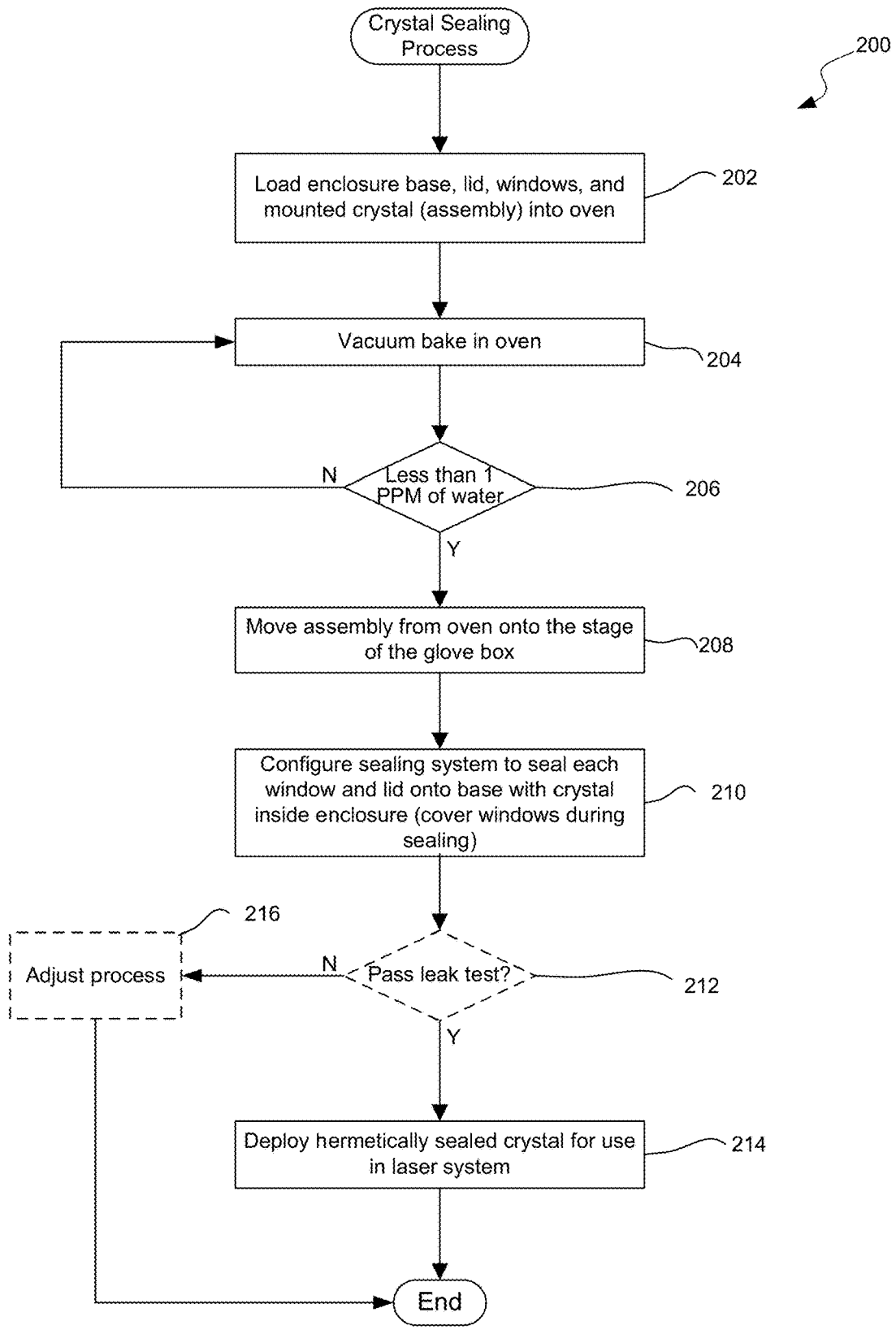
FIG. 2 is a flow chart illustrating a crystal sealing process in accordance with one embodiment of the present invention.

FIG. 2 is a flow chart illustrating a crystal sealing process 200 in accordance with one embodiment of the present invention, and such process 200 will be described with respect to the example system of FIG. 1. A hermetic base 102, lid 118, windows 116a and 116b, and mounted crystal 114 (or assembly components) may be initially loaded into the oven 120 of the hermetic sealing system 100 in operation 202. The oven 120 may also include one or more interlock doors (e.g., 120a) for loading these components therein.

The mounted crystal 114 may be initially provided within a different processing enclosure 115 in which the crystal was processed for frequency conversion, and such processing enclosure 115 with the crystal is loaded into the oven 120. The processing enclosure is typically kept purged or hermetically sealed so that the crystal remains dry and uncontaminated after processing. The processing enclosure 115 will typically include inlet and outlet ports 115b, which are closed, and a lid 115a that is bolted thereon and later removed. The crystal may be removed from the processing enclosure 115 once inside the low humidity environment of the glovebox 122. Additionally, a getter or desiccant material, such as zeolites, may be loaded into the oven, for example, by being placed in the enclosure cavity 104, as described further below.

After the components are placed in the oven 120, a vacuum bake may then be performed in operation 204. In the illustrated example, the hermetic sealing system 100 also includes one or more pumps (e.g., 136, 142) for bringing the oven 120 to vacuum. The interlock doors of the oven (e.g., outside door 120a and internal door 120b) remain closed during the baking process.

In one aspect, a user may select a temperature greater than ambient or room temperature, but less than the melting temperature of the crystal. For example, the oven 120 may be configured to heat the assembly components, including the crystal, to a range of about 100 to 350° C. or some other selected temperature to remove water from the assembly components. It is contemplated herein that the oven 120 may be configured to increase, decrease, and/or maintain the temperature of the assembly components at any feasible temperature or range of temperatures for substantially eliminating water from the components being baked. Accordingly, the foregoing temperature range is exemplary only and is not intended to limit the present invention in any way. The oven may be configured to heat or cool the assembly components to the selected temperature which may be a user selected temperature, a temperature determined utilizing one or more attributes of the crystal, or any temperature that eliminates water. The oven may be further configured to maintain the temperature of the assembly at or near the selected temperature for a selected period of time such as the time required to adequately reach a desired humidity level. For example, the time required to reach water levels of less than 1 PPM may be about 4 to 48 hours. The foregoing temperatures and time durations are included by way of example only, and it is contemplated that these parameters may be significantly altered without departing from the essence of this disclosure. Accordingly, nothing herein should be construed to limit the present invention in any way.

In general, the bake process includes pumping the oven down to vacuum and then baking the assembly components until certain humidity conditions are met. For instance, it may periodically be determined whether the humidity in the oven has reached a level that is less than one part per million (PPM) in operation 206. In the illustrated embodiment, controller 134 is configured to communicate with a water level monitor of the oven 120, which detects water levels, and determine whether the water content has been sufficiently lowered in the oven and its enclosed assembly components. If humidity has not dropped below one PPM, the baking process continues. Otherwise, the assembly (or assembly components) may be moved to the stage 128 of glove box system 122 in operation 208. For example, the door 120b is opened automatically by a controller (e.g., 134) after the humidity level falls below the predefined threshold or opened manually by a user reaching through the glove box's gloves 130 or via any other suitable user interface mechanism for opening the door 120b (e.g., external button, lever, touchscreen, etc.). In either case, the user may move the assembly from the oven 120 to the glove box system 122 after the door 120b is opened.

The sealing system 100 may be configured to seal each window and lid onto the base with the crystal inside the enclosure in operation 210. Alternatively, a test run of the process may include sealing the enclosure without placing the crystal inside. The windows may optionally be covered during the sealing process so as not to contaminate them with welding particulates. For example, the windows can be covered by a metal, kapton or other suitable material.

Figure 3A:
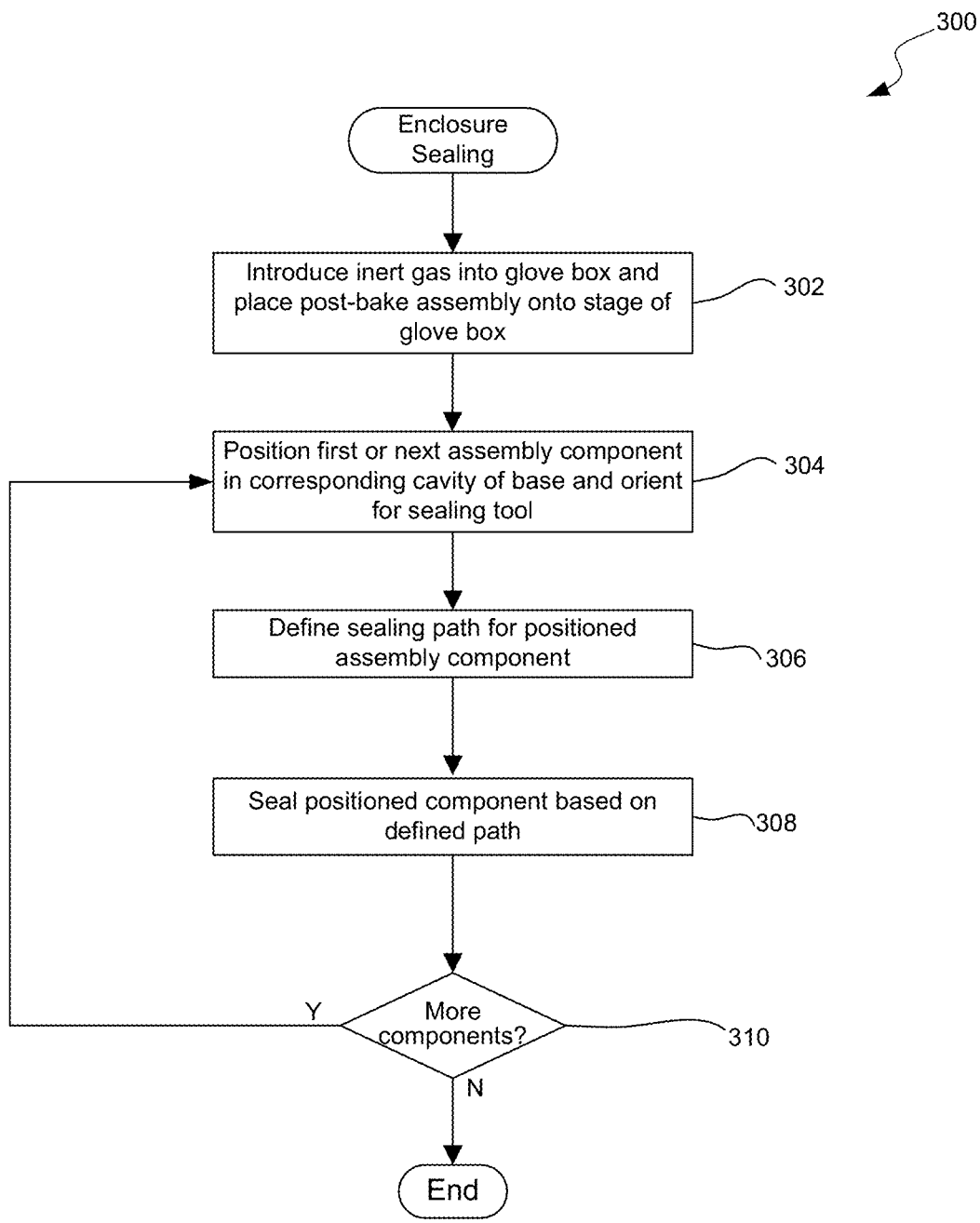
FIG. 3A is a flow chart illustrating an enclosure sealing process in accordance with one embodiment of the present invention.

Any suitable process for hermetically sealing the crystal into an enclosure may be utilized. FIG. 3A is a flow chart illustrating an enclosure sealing process 300 in accordance with one embodiment of the present invention. Initially, an inert gas may be introduced into the glove box and the post-bake assembly placed onto the stage of such glove box in operation 302.

The gas that is introduced into the glove box (or other chamber) may be any suitable gas that does not react adversely with the material used in the enclosure components or crystal during the sealing process. For example, Argon works well with a Titanium-based enclosure. Nitrogen is not ideal for a Ti enclosure since it would form TiN welds, which are too brittle for a hermetic sealing application. However, other types of gases may be selected based on the particular materials used in the enclosure components. Other suitable gases for other types of enclosure materials may include, but are not limited to, nitrogen, helium, gas blends, etc. A tracer gas, such as He, may also be introduced into the glove box so as to facilitate leak detection as further described herein.

In one embodiment, the components are assembled in the glove box 122 after baking. For instance, inside the glovebox the windows (e.g., 116a and 116b) are placed in the window holes (e.g., 110) of the base 102; the mounted crystal 114 is removed from the processing enclosure 115 and dropped into the base cavity 104; the lid 118 is placed within the lid opening 112; and the windows 116a and 116b are placed in the window openings. At least some or all of the enclosure components (such as the base 102, lid 118, and windows 116a-116b) may also be assembled prior to placement in the oven 120.

Referring back to FIG. 3A, the first assembly component may be positioned in its corresponding opening of the base 102 (if not already) and oriented under the sealing tool in operation 304. Sealing of the various components to form the enclosure may be performed in any suitable order. For instance, a user places the assembly on the stage via the gloves 130 of the glove box 122 so that one of its windows 116a or 116b is facing up and positioned in its corresponding window opening (e.g., 110) so as to be positionable under the laser welder 126.

Figure 3B:
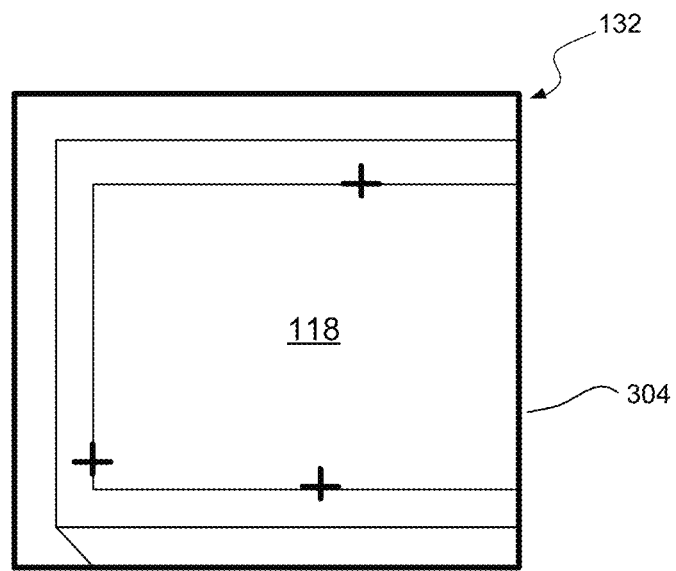
FIG. 3B illustrates an alignment process in accordance with one example implementation of the present invention.

Once a selected component is positioned, a sealing path for the positioned assembly component may then be defined. For example, the controller may be programmed with specific sealing paths for the lid and windows, and the user is prompted to enter a plurality of points on the sealing path for the currently positioned component so that the programmed path can be aligned for the sealing operation. Various techniques may be used for the user to select points on the path for alignment. FIG. 3B illustrates an alignment process in accordance with one example implementation of the present invention. In this embodiment, camera or microscope 144 generates an image of the component's top surface, which is positioned for welding, on the display 132. After prompting, the user can enter the component type ("lid" 118) and mark requested points along the welding path. In this example, the user is prompted to select 3 points on 3 different edges, which can then be used to define the path based on the pre-programmed sealing path being matched to the 3 points. A similar technique can be used to define the window paths.

The positioned component may then be sealed based on the defined path in operation 308. In a welding embodiment, the welder forms spot welds initially on each side of the lid (or at various spaced points around each window) and commences to weld around the entire path to hermetically seal the positioned component into place. The stage 128 may be driven by any suitable movement mechanism, such as stepper motors, for moving in XY directions and forming the welding seal. Any sealing or bonding processes may be used to hermetically seal the components of the enclosure. By way of example, flexible Indium foil may be clamped over ridged edges. A brazing or welding process may alternatively be used.

It may then be determined whether there are any more components to seal in operation 310. For instance, the process may be repeated for each window and the lid. After all components are welded, the process may end.

Referring back to FIG. 2, a leak test may optionally be performed in operation 212. Since NLO crystals are expensive (currently around $5000), the process 200 may initially be tested on an empty sealed enclosure prior to running the process 200 to enclose actual crystals. Any suitable leak test may be used. For instance, the sealing system 100 may include a He detector for detecting He after the glove box is purged of gas. It may be determined there is a leak when more than $1 \times e^{-8}$ He atm cc/sec are detected. If there is a leak in the enclosure, the enclosure will retain helium, which will leak out during the leak test. In a gross leak test, the enclosure can be immersed in a liquid to check for bubbles. It may be possible to check for leaks in a vacuum glove box so that the enclosure welding can be performed again when there is a crystal inside.

If the leak test is not passed, the process may be adjusted in operation 216 prior to use on actual crystals. Alternatively, a failed enclosure, which was formed with a crystal inside, may be repaired under vacuum. Otherwise, if the enclosure passes the leak test, the hermetically sealed crystal can be deployed (or after running the validated process 200 again to seal a crystal in another enclosure) for use in a laser system in operation 214.

The crystal may initially be stored prior to assembly into a laser system, for example, for 4 to 12 weeks. In this use case, the cuvette (enclosed crystal) may be kept in any environment, since the crystal is hermetically sealed. Without the cuvette the crystal would need to be in a dry purged environment, and if exposed to humidity, the crystal would be damaged or ruined. The cuvette removes the restriction of a few minutes of exposure in an ambient environment during laser assembly.

The crystal enclosure will eventually be assembled into an operating laser system. The hermetically sealed enclosure allows a less stringent operating environment and will likely have a longer crystal life (e.g., 120 weeks of continued operation). The crystal enclosure may also be removed from the laser or tool for periodic maintenance. The crystal enclosure may be kept in a purged environment during operation and maintenance.

When a tool is shipped, the cuvette may be shipped along with the tool in an ambient environment with a significant decrease in failure rates from humidity. The cuvette can be kept in place and not removed to be stored in a purged environment, which greatly simplifies the shipping process. Additionally, a laser assembled with the cuvette can be stored in the field in an ambient environment. For instance, a crystal enclosure may be shipped to an inspection tool site for later integration into the tool when needed. For example, the enclosed crystal may be stored and assembled into a laser system and tool when the current tool's crystal or laser system becomes damaged or a particular period of time expires (e.g., after 2 years).

Figure 4B:
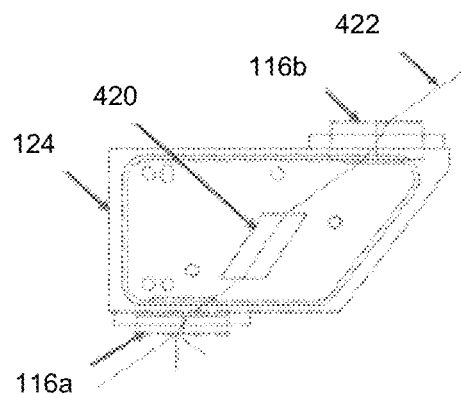
FIG. 4B illustrates a diagrammatic representation of use of a hermetically sealed crystal within its enclosure in accordance with one embodiment of the present invention.
Figure 4A:
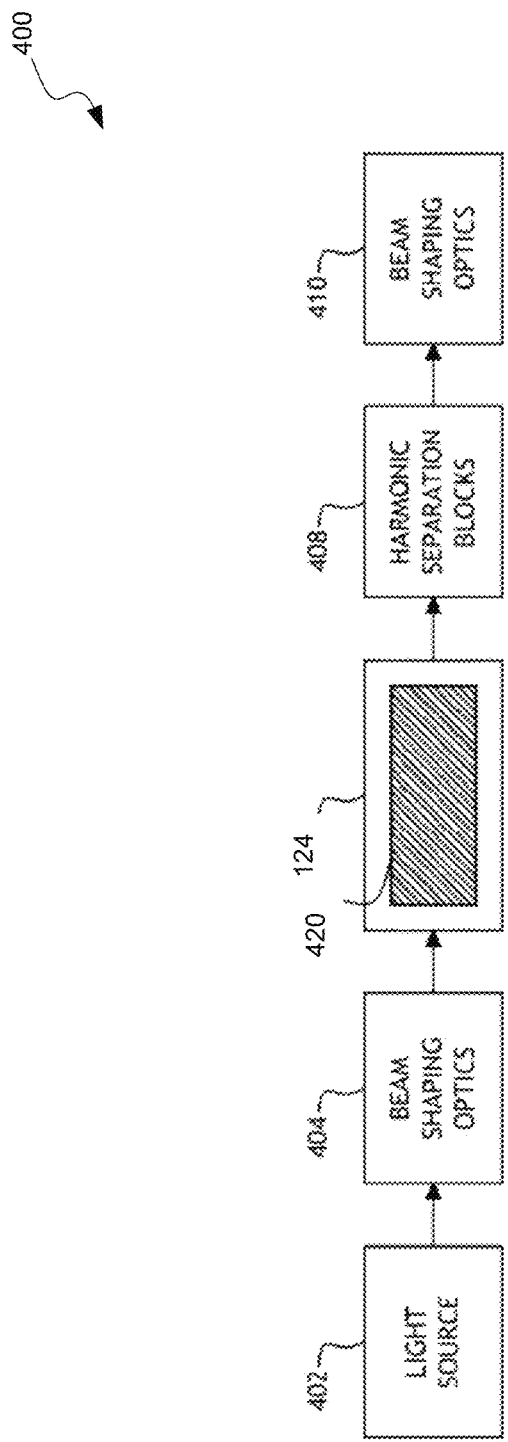
FIG. 4A illustrates a laser system equipped with a hermetically sealed enclosure in accordance with one application of the present invention.

FIG. 4A illustrates a laser system 400 equipped with a hermetically sealed enclosure 124 in accordance with one application of the present invention. The laser system 400 of the present invention may include, but is not limited to, a light source 402, a first set of beam shaping optics 404, a processed crystal 420 in its a hermetically sealed enclosure 124 as described previously herein, a set of harmonic separation elements 408, and a second set of beam shaping optics 410.

In one aspect, the output of a light source 402 may be focused to an elliptical cross-section Gaussian beam waist in or proximate to a passivated/annealed NLO crystal 420 using beam shaping optics 404. As used herein, the term "proximate to" is preferably less than half of the Rayleigh range from the center of crystal 420. In one embodiment, the aspect ratio between the Gaussian widths of the principle axes of the ellipse may fall between about 2:1 and about 6:1. In other embodiments the ratio between the principle axes of the ellipse may be between about 2:1 and about 10:1. In one embodiment, the wider Gaussian width is substantially aligned with the walk-off direction of the NLO crystal (e.g. to within about 10° of alignment).

In another aspect, the hermetically sealed enclosure 124 may protect the NLO crystal 420 from ambient atmospheric conditions and other impurities, thereby facilitating maintenance of its passivated/annealed condition. Note that a crystal exposed to atmospheric water and other impurities over time will begin to deteriorate and may revert back to an unpassivated or un-annealed state.

Beam shaping optics 404 may include anamorphic optics, which may change the cross section of output from light source 402. Anamorphic optics may include, for example, at least one of a prism, a cylindrical curvature element, a radially-symmetric curvature element, and a diffractive element. In one embodiment, light source 402 may include a laser producing a frequency in the visible range (e.g. 532 nm) to be doubled inside crystal 420. In other embodiments, light source 402 may include a laser source producing two or more frequencies to be combined inside crystal 420 to generate a sum or difference frequency. Frequency conversion and associated optics and hardware are described in U.S. patent application Ser. No. 13/412,564, filed on Mar. 6, 2012, by Dribinski et al., which is incorporated herein by reference in the entirety.

FIG. 4B illustrates a diagrammatic representation of the hermetically sealed crystal 420 within its enclosure 124 in accordance with one embodiment of the present invention. As shown, the crystal 420 receives a laser beam through first window 116a and output a frequency converted beam 422 through second window 116b.

Figure 5:
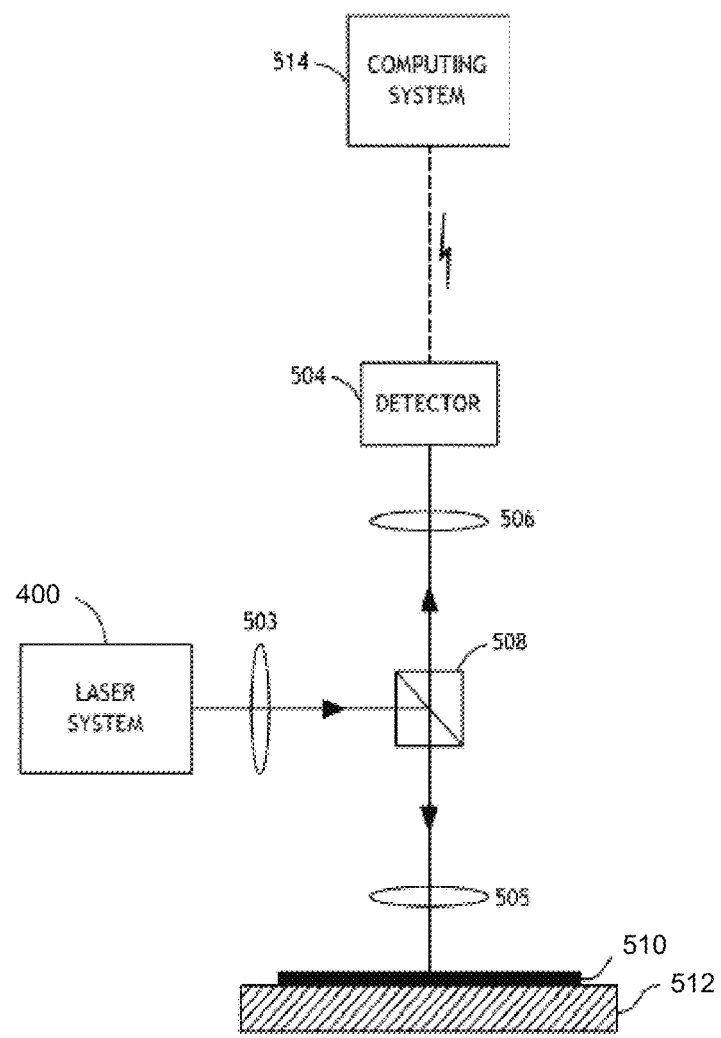
FIG. 5 illustrates an inspection system configured for measuring or analyzing defects of one or more samples, such as a photomask, wafer, or any other sample that may be analyzed utilizing an optical inspection system.

FIG. 5 illustrates an inspection system 500 configured for measuring or analyzing defects of one or more samples 510, such as a photomask (i.e., a reticle), wafer, or any other sample that may be analyzed utilizing an optical inspection system. The inspection system 500 may include a laser system 400 as described above. The laser system 400 may include one or more passivated/annealed NLO crystals 420 described throughout the present disclosure. In one embodiment, the NLO crystal 420 of the laser system 40 may be sufficiently annealed to reduce the water content of the NLO crystal 420 to a selected water content level.

The NLO crystal 420 may be passivated to a selected degree of passivation that is acceptable for achieving desired physical/optical performance, improved LID resistance, improved output beam quality, improved output stability, increased crystal lifetime, or higher operating power.

The NLO crystal 420 of the laser system 400 may have at least one absorption band in the IR spectrum of the NLO crystal 420 correlated to the presence, absence, or amount of OH bonds of the NLO crystal 420. The absorption band of the NLO crystal 420 may be measured utilizing FTIR to determine the degree of passivation or the water content level of the NLO crystal 420. A specified amplitude or intensity of the absorption band of the NLO crystal 420 may correspond to the sufficient annealing level or the sufficient passivating level of the NLO crystal 420. The specified amplitude or intensity of the absorption band may be a user 420 value, or a value determined utilizing one or more attributes of the NLO crystal 420. Accordingly, the absorption band of NLO crystal 420 of the laser system 400 may have an amplitude or intensity at or near the specified amplitude or intensity. The laser system 400 may further include at least one electromagnetic source, such as a diode pumped solid state (DPSS) source or a fiber IR source, configured to provide illumination to the NLO crystal 420. At least a portion of the illumination provided by the electromagnetic source may be directly or indirectly transmitted through the NLO crystal 420 in a frequency conversion process of the crystal 420.

The inspection system 500 may further include a sample stage 512 configured to hold the sample 510 during the inspection process. The sample stage 512 may be configured to hold the sample 510 in a location where the sample 510 may receive at least a portion of illumination transmitted from the laser system 400. The sample stage 512 may be further configured to actuate the sample 510 to a user selected location. The sample stage 512 may further be communicatively coupled to one or more computing systems and configured to actuate the sample 510 to the user selected location or to a location determined by the computing system, wherein the sample 510 may receive at least a portion of illumination transmitted from the laser system 400.

The inspection system 500 may further include a detector 504 configured to directly or indirectly receive at least a portion of illumination reflected from a surface of the sample 510. The detector 504 may include any suitable detector known to the art, such as a charged coupled device (CCD) or a time-delay-and-integration (TDI) CCD based detector. The inspection system 500 may further include one or more computing systems 514 communicatively coupled to the detector 504 (as well as other system components). The computing system 514 may be configured to receive information regarding characteristics of illumination reflected from the surface of the sample 510 from the detector 504. The computing system 514 may be further configured to execute an inspection algorithm from program instructions on a carrier medium. The inspection algorithm may be any inspection algorithm known to the art for measuring one or more defects of the sample 510 utilizing information regarding characteristics of illumination reflected from the surface of the sample 510. Accordingly, the computing system 514 may utilize information regarding illumination reflected from the surface of the sample 510 to make measurements, such as presence, absence, quantity, and/or type of defects of the sample 510.

The inspection system 500 may include one or more illumination optical elements 503 (e.g. retarders, quarter wave plates, focus optics, phase modulators, polarizers, mirrors, beam splitters, reflectors, converging/diverging lenses, prisms, etc.). The illumination optical elements 503 may be configured to directly or indirectly receive illumination emanating from the laser system 400. The illumination optical elements 503 may be further configured to transmit and/or direct at least a portion of illumination directly or indirectly received from the laser system 400 along an illumination path of the inspection system 500 to the surface of the sample 510. The illumination path may be any path along which illumination can travel from the laser system 400 to the surface of the sample 510, such as a direct line of sight between the laser system 400 and the surface of the sample 510. In some embodiments, the illumination path may be a path delineated by a configuration of one or more optical elements including, but not limited to, the illumination optical elements or any other optical elements disclosed herein.

In one embodiment, the illumination path of the inspection system 500 may include a beam splitter 508 configured to transmit at least a portion of illumination received directly or indirectly from the laser system 400 to the surface of the sample 510 or to a further component of the illumination path. The beam splitter 508 may be any optical device capable of splitting a beam of illumination into two or more beams of illumination. The illumination path may further include inspection optical elements 505 (e.g. retarders, quarter wave plates, focus optics, phase modulators, polarizers, mirrors, beam splitters, reflectors, converging/diverging lenses, prisms, etc.) configured to transmit at least a portion of illumination received directly or indirectly from the laser system 400 to the surface of the sample 510.

In one embodiment the inspection system 500 may include collection optical elements 506 (e.g. retarders, quarter wave plates, focus optics, phase modulators, polarizers, mirrors, beam splitters, reflectors, converging/diverging lenses, prisms, etc.) configured to directly or indirectly receive at least a portion of illumination reflected from the surface of the sample 510. The collection optical elements 506 may be further configured to transmit at least a portion of illumination directly or indirectly received from the surface of the sample 510 along a collection path of the inspection system 500 to the detector 504. The collection path may be any path along which illumination can travel from the surface of the sample 510 to the detector 504, such as a direct line of sight between the surface of the sample 410 and the detector 504. In some embodiments, the collection path may be a path delineated by a configuration of one or more optical elements including, but not limited to, the collection optical elements or any other optical elements disclosed herein.

While the present disclosure describes the inspection system 500 in the context of generically inspecting one or more samples, it is contemplated that the inventive aspects of the inspection system 500 may be extended to wide array of inspection or metrology systems utilized in the fabrication or analysis of semiconductors or semiconductor components. The inspection system 500 may be configured for one or more modes of operation known to the art. For example, the inspection system 500 may be configured for bright-field inspection, dark-field inspection, or any other mode or configuration now or hereafter known to the art. The inspection system 500 may be further configured for one or more inspection capabilities known to the art. For example, the inspection system 500 may be configured for inspecting one or more photomasks, patterned wafers, unpatterned wafers, or any other inspection capability now or hereafter known to the art.

It should be recognized that the various steps described throughout the present disclosure may be carried out by a single computing system (e.g., controller 134 or computer system 514) or, alternatively, multiple computing systems. Moreover, different subsystems of the system may include a computing system suitable for carrying out at least a portion of the steps described above. Therefore, the above description should not be interpreted as a limitation on the present invention but merely an illustration. Further, the one or more computing systems may be configured to perform any other step(s) of any of the method embodiments described herein.

The computing system may include, but is not limited to, a personal computing system, mainframe computing system, workstation, image computer, parallel processor, or any other device known in the art. In general, the term "computing system" may be broadly defined to encompass any device having one or more processors, which execute instructions from a memory medium.

Program instructions implementing methods such as those described herein may be transmitted over or stored on carrier medium. The carrier medium may be a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Accordingly, the present embodiments are to be considered as illustrative and not restrictive, and the invention is not to be limited to the details given herein.

What is claimed is:

1. A system for hermetically sealing a nonlinear optical (NLO) crystal for use in a laser system, comprising:
    an oven for receiving and baking a mounted NLO crystal, an enclosure base, a lid, and a plurality of window components, wherein the NLO crystal has been processed for frequency conversion;
    an environmentally controlled chamber coupled with the oven and having a stage for receiving the mounted NLO crystal, enclosure base, lid, and plurality of window components from the oven after baking has resulted in a humidity level that is less than a predefined amount that will not damage the mounted NLO crystal, wherein the chamber includes a sealer tool for hermetically sealing the mounted NLO crystal into the enclosure base by sealing the lid and plurality of window components into openings of the enclosure base with the crystal being inside a cavity of the enclosure base; and
    a controller for causing, in cooperation with the oven and sealing tool, the following operations:
        baking the mounted NLO crystal, enclosure base, lid, and plurality of window components until the humidity level is less than the predefined amount, wherein the baking occurs after the enclosure base, the lid, and the plurality of window components are separately received into the oven and prior to hermetically sealing the enclosure base, the lid, and the plurality of window components together to enclose the mounted NLO crystal within the enclosure base, and
        after baking, hermetically sealing the mounted NLO crystal into the enclosure base by sealing the lid and plurality of window components into openings of the enclosure base to thereby form a crystal enclosure.

2. The system of claim 1, wherein the chamber is a glove box, and the controller is configured to prompt a user to position the mounted NLO crystal, enclosure base, lid, and plurality of window components from the oven to the stage of the glovebox in an orientation to seal each of the lid and window components onto the enclosure base with the mounted crystal inside.

3. The system of claim 1, wherein the controller is configured to prompt a user or a robotic arm to:
    move the lid, the plurality of window components, and the enclosure base to the stage of the chamber,
    position the lid into a first one of the openings of the enclosure base and define a lid path for the sealer tool to follow and thereafter seal the lid into the first opening of the enclosure base into which the mounted NLO crystal is placed, and
    position each window component into a corresponding one of the openings of the enclosure base and define a window path for the sealer tool to follow and thereafter seal such window component into its corresponding opening of the enclosure base into which the mounted NLO crystal is placed.

4. The system of claim 3, wherein:
    the sealer tool is a welder tool,
    the enclosure base and lid are formed from a metallic material,
    the window components each include a window mounted in a metallic material, and
    the controller is further configured to prompt the user or the robotic arm to mark a plurality of points along each lid path and each window path.

5. The system of claim 4, further comprising
    a camera or microscope for generating an image of each positioned lid and window component within its corresponding opening of the enclosure base,
    wherein the controller is configured to prompt a user to mark the plurality of points along each lid path and each window path via marking a plurality of marks on each image generated for each positioned lid and window component.

6. A method of hermetically sealing a nonlinear optical (NLO) crystal for use in a laser system, comprising:
    loading a mounted NLO crystal, an enclosure base, a lid, and a plurality of window components into an oven;
    vacuum baking the mounted NLO crystal, enclosure base, lid, and plurality of window components until a humidity level that is less than a predefined amount is reached, wherein the enclosure base, the lid, and the plurality of window components are separately loaded into the oven and vacuum-baked prior to hermetically sealing the enclosure base, the lid, and the plurality of window components together to enclose the mounted NLO crystal within the enclosure base;

moving the mounted NLO crystal, enclosure base, lid, and plurality of window components from the oven onto a stage of a glove box that includes a sealing tool; and in the glove box, hermetically sealing the mounted NLO crystal into the enclosure base by sealing the lid and plurality of window components into openings of the enclosure base so as to form a crystal enclosure.

7. The method of claim 6, wherein during loading and vacuum baking, the mounted NLO crystal resides in a processing enclosure in which such crystal was processed, the method further comprising, within the glove box, removing the mounted NLO crystal from the processing enclosure and placing the mounted NLO crystal into the enclosure base.

8. The method of claim 6, further comprising loading, vacuum baking, and hermetically sealing a getter or desiccant material into the enclosure base with the mounted NLO crystal.

9. The method of claim 6, further comprising automatically opening a door between the oven and glove box when the humidity level is less than a predefined amount.

10. The method of claim 6, wherein the predefined amount for the humidity level is less than one part per million.

11. The method of claim 6, further comprising performing the operations of loading, vacuum baking, moving, and hermetically sealing for a mounted NLO crystal only after performing such operations without a mounted NLO crystal in a test run that results in no leaks from the crystal enclosure.

12. The method of claim 11, wherein the hermetically sealing operation is performed in an atmosphere that includes a tracer gas that is detected in the test run if there is a leak in the crystal enclosure.

13. The method of claim 6, wherein the sealing tool is a laser weld, and the method further comprises temporarily covering the window components prior to performing the operation of hermetically sealing to prevent contamination of the window components with welding particulates.

14. The method of claim 6, further comprising assembling a laser system using the crystal enclosure.

15. The method of claim 14, further comprising storing the laser system in an ambient environment at least 5 minutes.

16. The method of claim 15, further comprising mounting the laser system into a semiconductor inspector tool.

17. The method of claim 14, further comprising storing the laser system in an ambient environment at least 1 week.

18. The method of claim 6, further comprising:
prompting a user to move the lid, the plurality of window components, and the enclosure base, into which the mounted NLO crystal is placed, to the stage of the chamber,
prompting the user to identify and position the lid into a first one of the opening of the enclosure base and define a lid path for the sealer tool to follow and thereafter seal the lid into the first opening, and
prompting the user to identify and position each window component into a corresponding one of the openings of the enclosure base and define a window path for the sealer tool to follow and thereafter seal such window component into its corresponding opening.

19. The method of claim 18, further comprising:
prompting the user to mark a plurality of points along each lid path and each window path.

20. The method of claim 19, wherein the user is prompted to mark the plurality of points along each lid path and each window path via marking a plurality of marks on an image that is generated for each positioned lid and window component.

* * * * *